United States Patent [19]

Plows et al.

[11] 3,952,146

[45] *Apr. 20, 1976

[54] ELECTRON BEAM RECORDING OF WIDE-BAND SIGNALS ON THERMOPLASTIC FILM

[75] Inventors: Graham Stuart Plows; Gordon Malcolm Edge, both of London, England

[73] Assignee: Decca Limited, London, England

[ * ] Notice: The portion of the term of this patent subsequent to June 28, 1991, has been disclaimed.

[22] Filed: Apr. 23, 1974

[21] Appl. No.: 463,252

Related U.S. Application Data

[63] Continuation-in-part of Ser. No. 247,443, April 28, 1972, Pat. No. 3,821,488.

[30] Foreign Application Priority Data

Apr. 28, 1971 United Kingdom............... 11993/71

[52] U.S. Cl. .................... 178/6.6 TP; 179/100.1 B; 179/100.3 V; 179/100.4 C
[51] Int. Cl.² ....................... G11B 3/00; H04N 5/82
[58] Field of Search ......... 178/6.6 A, 6.6 TP, 6.6 R, 178/6.7 R, 6.7 A; 346/74 TP, 77 E; 340/173 TP; 179/100.4 C, 100.3 A, 100.3 G, 100.1 B, 100.3 V

[56] References Cited

UNITED STATES PATENTS

| 3,120,991 | 2/1964 | Newberry et al. ............. | 178/6.6 TP |
| 3,287,563 | 11/1966 | Clunis .......................... | 340/173 TP |
| 3,737,589 | 6/1973 | Redlich et al. ................ | 179/100.4 C |

Primary Examiner—Raymond F. Cardillo, Jr.
Attorney, Agent, or Firm—Edward F. Connors

[57] ABSTRACT

This invention concerns a method of recording wide-band signals on a thermoplastic film. The signal to be recorded is converted to an intensity modulation of a beam of electrons which is directed at the surface of a thin thermoplastic film carried on a conductive substrate. The film is rotated in its own plane and simultaneously translated so that the beam scans the film in a track which follows a spiral path. The deposition of charge produces after heating of the film a spatial modulation of the film. The intensity of the beam and the beam's impingement on the film is controlled in order that the charge pattern is appropriate for the formation of a spiral groove which is substantially invariant in cross-section but varies in depth along its direction of progression in accordance with the signal that modulates the intensity of the beam of electrons. The recording thus made can be used for the production of video discs capable of mechanical playback.

9 Claims, 19 Drawing Figures

FIG.8

ELECTRON BEAM RECORDING OF WIDE-BAND SIGNALS ON THERMOPLASTIC FILM

This application is a continuation-in-part of our prior co-pending application Ser. No. 247,443 filed 28th Apr. 1972, now U.S. Pat. No. 3,821,488.

FIELD OF THE INVENTION

This invention relates to recording signals and particularly to a method of recording a wide-band signal, particularly a television picture signal, in the form of a spatially modulated groove formed in a thermoplastic disc.

The main purpose of the present invention is to achieve recording of a television signal on a medium which can be used in the production of video discs, that is to say, discs which can be played back by means of a stylus that physically engages a groove in the disc. However the invention is directed to the production of a recorded thermoplastic disc or the like and is not limited to the subsequent production of a video disc after, for example, metallisation of the thermoplastic disc to form a master matrix for the production by suitable presses of mechanically playable video discs.

BACKGROUND OF THE INVENTION AND THE PRIOR ART

One of the features of the present invention is the modulation of a beam of electrons which is brought to a focus and directed at a thin thermoplastic film disposed on a conductive substrate. This expedient leads to the deposition of a track of charge on the thermoplastic film and the excess pressure which is exerted on the surface of the film by virtue of the forces between the deposited charge and the conductive substrate produces a local radius of curvature, which is determined by the local charge density, after the film is softened by heating. Accordingly the contours of the film can be formed in accordance with the time variation of the intensity of the beam and subsequent to the deposition of charge and the heating of the film, which may occur either before or after the deposition of charge, the film may be cooled so as to freeze the film into the contoured shape in which it is formed by the combined effects of the deposition of charge and the softening of the film by heating.

This method of recording was, so far as is known, originally developed by William E. Glenn, and is disclosed for example in U.S. Pat. No. 3,113,179 issued 3rd Dec. 1963. In that Patent the apparatus disclosed is arranged to scan the surface of a thermoplastic film by means of an intensity modulated beam of electrons and the scanning is such to produce a pattern of charge which defines a composite diffraction grating which, upon transmission of light therethrough, produces a visible pattern representative of the electric input signals. The aforementioned Patent is confined to a disclosure of the production of a diffraction grating, which is substantially different in nature to the formation of a groove which is one of the objects of the present invention. The particular cross-section of the grooves forming the diffraction pattern is of no particular consequence since it is primarily the spacing and depth of the deformations which are of importance.

Essentially the same method of recording is disclosed in the subsequent U.S. Pat. No. 3,120,991 to Newberry et al issued 11th Feb. 1964.

One proposal for a spatial coherent reproducing system which includes the recording of a signal in a spiral groove is disclosed by Clunis in U.S. Pat. No. 3,287,563. In that Patent there is disclosed a system which includes a thermoplastic disc disposed on an inert translucent base. A video signal is applied to a frequency modulator which controls an electron beam that is directed to strike the surface of a thermoplastic disc. The disc is rotated and translated so as to produce spiral scanning of the film by the beam of electrons. The Patent does not however disclose or suggest any acceptable means for producing a disc which is mechanically playable. No recording parameters are suggested and the method of readout is apparently an optical method for which the translucent substrate is desirable. There is in particular no reference to how the beam should be controlled in practice in order to produce a suitable pattern of charge. This is important as far as another aspect of this invention is concerned, namely that the effective diameter of the electron beam in the direction along the direction of progression of the track of charge is limited by the shortest wavelength that has to be recorded but in practice is very much less than the width of track which is necessary for the formation of a groove that can properly be engaged by a stylus.

Another proposal for forming depressions in a record medium is disclosed in British Pat. Specification No. 1108565 published 3rd Apr. 1968. In that method a laser beam is generated and directed onto the surface of a record medium so as to soften a portion of the surface which is maintained strongly electrically charged. The laser beam is laterally vibrated and the electrical charge is also modulated to produce both depth and lateral modulation of the spiral depression which is formed. This method of recording is fundamentally different from the two methods that have been described hereinbefore and is substantially different from the method employed in the present invention wherein the beam of electrons is used to deposit a charge and the film is heated by other means. Moreover the disclosure in British Pat. No. 1,107,565 gives no guidance on the particular modulation of the laser beam or, more importantly, how to control an electron beam to lay down a track of charge which is wider than the shortest wavelength to be recorded and yet is adapted to produce a shape of groove which, after conversion into a disc record, can properly be played by a stylus engaging the correspondingly shaped groove in a derivative disc.

A further proposal for recording mechanically reproducable high frequency signals on carriers is disclosed in U.S. Pat. No. 3,737,589 issued 5th June 1973 but bearing a foreign priority date of 1st Aug. 1970. The method disclosed in this Patent consists of using a photoresist which is variably softened by an electron beam or a laser beam by an amount corresponding to the intensity of the beam. The Patent discloses the movement of the beam so that it acts as a cutting surface, for which purpose the beam is transversely deflected at a frequency of approximately 15 MHz and is, in addition to being modulated in accordance with the frequency of the signal to be recorded, modulated at a frequency twice the transverse deflection frequency. Although this method as applied to a photoresist can produce a groove of approximately V-shaped cross-section the application of the method to deposition of electric charge by an intensity modulated beam of electrons is insufficient since as will be explained hereinafter it is normally appropriate to control the beam of electrons so that every point on the film which corresponds to a point within the width of the groove that is formed receives charge in order that the film be deformed properly. Hereinafter there is disclosed an embodiment of the invention in which the beam of electrons is deflected transversely at a suitable rate but it is important in such a case to ensure that the rate of transverse oscillation of the beam is sufficient to deposite charge at least twice on every point that is within the width of the spiral track so formed. Moreover, in such an embodiment it is usually necessary to provide, as explained hereinafter, blanking of the beam at the extremities of its transverse movement. The arrangement shown in U.S. Pat. No. 3,737,589 is accordingly not adapted to producing a deposited track of charge which, subject to softening of the thermoplastic film, deforms the thermoplastic film into a shape whose contours correspond to the signal to be recorded and which define a properly shaped groove.

Another proposal for recording video signals on a disc is disclosed by W. R. Johnson et al in U.S. Pat. No. 3,361,873 issued 2nd Jan. 1968. In that method a disc of sensitive material is scanned in a spiral path by a modulated beam of electrons in order to produce a spiral recording which photographically corresponds to the signal that modulates the beam of electrons. This arrangement is substantially different from the present invention and the aforementioned Patent gives no guidance on the particular parameters to be adopted for the control of the electron beam wherein it is desired to produce a spiral, modulated groove by the combined effects of deposition of charge and softening of the thermoplastic film.

Another proposal for recording signals on a disc is disclosed by Lemoine in U.S. Pat. No. 2,897,710 issued 4th Aug. 1959. In that Patent a light source produces an optical beam which is directed towards a photosensitive disc and the disc is rotated and translated relative to the source in order to produce a spiral groove. This expedient is substantially different from the deposition of electric charge and the production of a groove by the combined effect of softening the film by deposition of charge and the Patent gives no guidance on how to produce a spiral groove which is substantially wider than the shortest wavelength to be recorded.

SUMMARY OF THE INVENTION

The present invention provides for the recording of a television picture signal or other wide-band signal by directing a beam of electrons at a thermoplastic film carried on a conductive substrate which is a thin chromium film carried on a glass disc. The film is transversed relative to the beam and this is preferably achieved by rotating the film in its plane and simultaneously translating it its plane so that the point of impingement of the beam of electrons on the surface of the film follows a spiral path. The intensity of the beam is modulated in accordance with the signal to be recorded. Preferably the beam is modulated by a frequency modulated carrier signal which carries a television picture signal together with appropriate synchronising pulses as a frequency modulation. The modulation of the electron beam in this manner produces a lengthwise variation in the density of the deposited charge. In addition the intensity of the beam and its impingement on the track are controlled so that the charge distribution across the width of the track, that is to say transverse the direction of progression of the spiral path, is least at the edges of the track and greatest in the centre. There are disclosed several methods of achieving such a charge distribution. In any event it is desirable to ensure that charge is deposited over the whole region which will correspond to the area within the boundaries of the groove that is formed subsequent to both the deposition of charge and the softening of the thermoplastic film by heating. One possibility is to oscillate the beam transversely at such a frequency, substantially higher than the frequency of variation of the intensity of the beam in accordance with the video signal, that is sufficient to cover every point on the track of charge that is deposited at least twice which, as explained hereinafter, ensures that each point is covered at least once. It is possible to vary the frequency of transverse oscillation in accordance with the effective tangential velocity of the film where the beam strikes it but it is also possible to select the frequency of oscillation so high, for example at 50 MHz or thereabouts, that is the frequency of transverse oscillation is always high enough to ensure the double deposition of charge. A further possibility however consists of introducing astigmatism deliberately into the focussing of the electron beam so that the effective diameter of the beam is relatively narrow in the sense along the direction of progression of the track but is substantially wider in the sense across the track.

Either before or after the charge is deposited the film is heated so that the variable electrostatic attraction between the deposited charge and the conductive substrate deforms the surface of the film into the required shape. On cooling of the disc the deformations are frozen. Subsequently if desired the recorded disc can be metallised and otherwise treated so as to produce a nickel master which can be used in a press for the reproduction of discs on a large scale.

DESCRIPTION OF THE PREFERRED EMBODIMENTS

Figure 1:
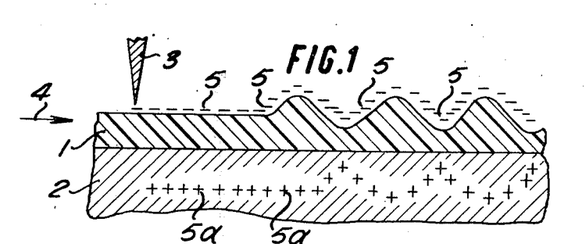
FIG. 1 is an explanatory diagram showing in longitudinal section the effect of depositing electric charge on a soft thermoplastic film.

FIG. 1 illustrates a thin film 1 of thermoplastic material disposed on the surface of a conductive member 2 which is preferably a conductive disc. The film 1 is scanned by a focused electron beam, commonly called an electron probe, and the film is transversed in a manner particularly described hereinafter, the movement being illustrated in FIG. 1 by the arrow 4. The electron probe 3 deposits a track of electric charge 5 on the surface of the film 1 and as the film is traversed the track follows a path determined by the particular relative movement of the probe and the film.

It is preferred to rotate the film in its plane and simultaneously translate it in order that the path that the track follows is a spiral of which the convolutions are centred on the centre of rotation of the film. The formation of a spiral track is desirable where recordings in the form of playable discs are to be derived from the half-master record made according to the present invention.

Where charge is deposited on the track, an excess pressure is exerted on the surface of the film 1 owing to the forces between the deposited charge 5 and the conductive disc 2. It is possible to calculate with considerable accuracy the pressure which is developed using the method of images in which there is assumed to be an equal charge 5a of opposite sense located below the surface of the conductor at the depth equal to the thickness of the film 1. If the thermoplastic material is already or is not softened, the pressure due to the charge 5 produces a local radius of curvature which is determined by the local charge density and the pressure due to the charge 5 pulls the surface of the film towards the conductive substrate constituted by the disc 2 until the excess pressure is balanced by the surface tension of the film.

It will be apparent that in the highly charged regions of the track the surface of the film 1 is depressed and becomes concave whereas in the less highly charged regions the surface becomes convex.

Figure 2A:
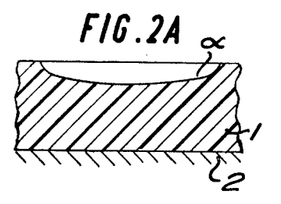
FIGS. 2A, 2B and 3 illustrate profiles of grooves formed in a thin thermoplastic layer.
Figure 2B:
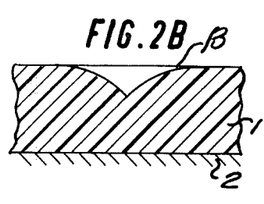
Figure 3:
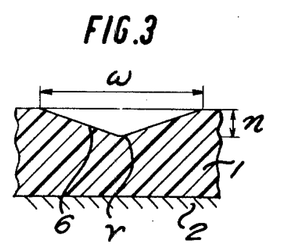

FIGS. 2A and 2B illustrate the limits of possible profiles for a groove. Both illustrate the appearance of a groove after charge has been deposited and the film softened. FIG. 2A illustrates the cross-section of a groove which would be formed if a uniformly dense strip of charge is laid along the track. In FIG. 2 the groove has a profile $\alpha$ which is only slightly curved over most of its width. FIG. 3 illustrates a groove with a profile $\beta$ which would be produced if a (theoretically unobtainable) line charge constituted the track. The profile $\beta$ exhibits a well defined notch from which the sides of the groove slope convexly up to the surface of the film 1.

FIG. 3 illustrates a groove of ideal characteristics although there may be slight variations from the ideal which would not substantially adversely affect the quality of a recording. The groove 6 illustrated in FIG. 3 has a width $w$ of the order of 3 to 10 microns, a depth $h$ of approximately 0.5 microns with a rounded apex of which the radius of curvature $r$ is about 1 micron. Such a groove is produced by a transverse distribution of charge density between the theoretical uniformly dense tracks (FIG. 2A) and the theoretical line charge (FIG. 2B). We have found that it is possible to produce a profile of the form and dimensions shown in FIG. 3 using an electron beam of which the intensity varies as a function of the distance from the centre of the beam in accordance with an approximately Gaussian distribution. Such a distribution is in fact the normal distribution for the intensity of an electron beam but herein lies the principal difficulty in the deposition of a track of charge that must form a groove and yet be capable of providing the groove with a longitudinal modulation of sufficient range to accommodate a wide-band signal such as a television signal. The Gaussian distribution which would be necessary to produce a track of charge suitable for the formation of a groove 6 of the profile shown in FIG. 3 would have to be relatively wide, of the order of 3 to 10 microns. That is to say, the spread must be wide enough to ensure that significant charge is deposited over the whole width of the track that corresponds to the groove that is ultimately formed. It is possible to provide a measure of the spread of a Gaussian curve by using the distance between the points that define a magnitude which is half the maximum magnitude of the Gaussian curve. In the following the term "effective diameter" will be used to describe the "half-height" diameter. In order to produce a track of charge which is approximately 7 microns wide the effective diameter of the Gaussian curve should be of the order of 3.5 microns. The spread of the curve and accordingly the effective diameter must be greater if a wider groove is required. However the narrowest width of groove tends to be limited by the size of stylus that can be feasibly used to play back the corresponding groove in a derived pressing and the need to ensure that the stylus does reliably engage the groove.

Another factor which is important in determining the dimensions of the electron probe is the frequency that has to be recorded. The present invention provides for recording the signal that controls the intensity of the beam as a variation in the depth of the groove. The choice for the beam diamter is accordingly dictated by the shortest wavelength of the signal that is to be recorded on the film. On the assumption that a band width of 6 MHz is required for recording, this bandwidth corresponding to the band-width required for colour television signals, the shortest wavelength that may have to be recorded is 1.3 microns. In order to record a wavelength of 1.3 microns the maximum effective diameter of the electron beam should not be greater than approximately half this wavelength that is to say it should not exceed 0.65 microns.

Accordingly, if the diameter of the beam is of the order of 0.5 to 1 microns then it is insufficiently wide to produce a proper profile, in the transverse sense, for the groove. Moreover the groove should normally be of substantially constant shape but of variable depth at its centre.

The conflicting requirements for the effective diameter of the beam are resolved by the present invention in the manner described hereinafter.

Before describing the features of apparatus which can be used to perform the present invention, it is convenient to discuss the physical requirements for the thermoplastic film. The term "thermoplastic" is no used in the specialised sense to denote any specific group of chemical compounds. A variety of substances including various waxes, would be suitable. One thermoplastic material that is suitable is polystyrene which can be sprayed, painted or spun on to the conductive disc and if necessary partially scraped off to leave a film of suitable thickness. In general the thickness of the film should be approximately 10 microns or less.

The thermoplastic film should fulfil several physical requirements. The first is that is should be electrically resistive by which is meant in general a bulk resistivity of more than $10^{11}$ ohm cm. when fluid and more tha $10^{16}$ ohm cm. when solid. The high electrical resistivit in the solid state is necessary so that the film can retai the deposited charge without significant leakage thereof for the duration of the scanning of the film by the electron probe. Preferably the thermoplastic is solid at ordinary temperatures in order to make recording convenient. A softening point between 60° Celsius and 100° Celsius is preferable. A fairly sharp softening point is also desirable. Typically the thermoplastic may be solid up to 65° Celsius but fluid at 85° Celsius. It is usually necessary to perform the scanning of the film by the electron probe in an evacuated chamber and for this purpose the vapour pressure of the film should be below $10^{-2}$ millimeters of mercury and preferably below $10^{-5}$ millimeters of mercury. The viscosity of the thermoplastic film in a softened state is preferably of the order of 10,000 centistokes. Moreover it should be stable in the presence of radiation so that during recording no perceptible radiation damage occurs. Another requirement which is appropriate in practice is that the thermoplastic film should be capable of receiving, for example by an evaporation method, a thin metal layer. Normally in the art of making gramophone records a master is provided with a thin metal layer for the purpose of making, after additional processing, a "mother" recording from which pressing can be made. The thin metal layer deposited on the master may be electro-plated and finally the metal "negative" would be removed from the thermoplastic film. Thus the thermoplastic film should be capable of releasing the metal layer without damage. However the range of possible thermoplastic materials can be extended considerably by the use of a release agent which may be sprayed onto the film before it is metallised.

Figure 4:
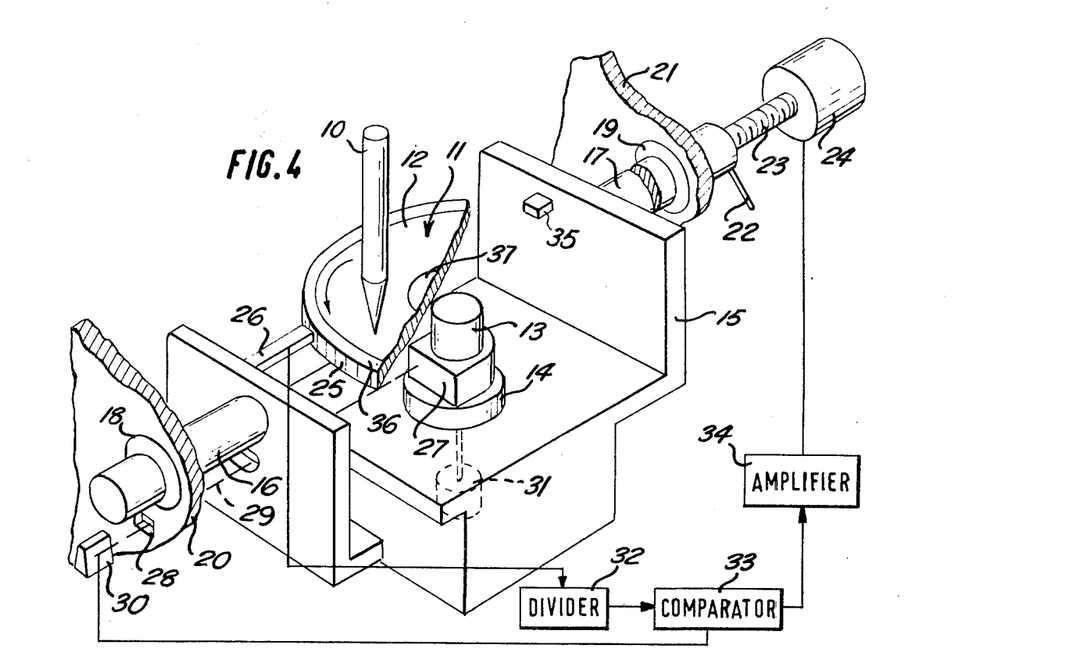
FIG. 4 illustrates principally the mechanical features of an apparatus for recording signals on a thermoplastic film using electron beam scanning.

FIG. 4 illustrates the mechanical and some associated control elements of an apparatus suitable for recording according to the present invention. The apparatus includes an electron probe, that is to say a focused beam of electrons 10 which can be produced by an electron column of the form described with reference to FIG. 5. The electron probe is directly vertically downwards toward a thin thermoplastic layer 11 carried on a conductive disc 12. The disc is mounted for rotation about its principal axis on a vertical shaft 13. Thus the rotation of the shaft 13 will rotate the film 11 in the plane of the film itself. The shaft 13 is mounted in a bearing 14 which is carried by a carriage 15 mounted for horizontal movement at right-angles to the axis of the vertical shaft 13. The shaft 13 and the bearing 14 may be removable together with the disc or the disc may be mounted by means of a kinematic support as described in U.S. Pat. application Ser. No. 384,637 filed 1st Aug. 1973 and now U.S. Pat. No. 3,870,321 issued Mar. 11, 1975. Alternatively the disc may be mounted on the shaft 13 by means of the centering and fixing device as described in United States Patent application Ser. No. 412,895 filed 5th Nov. 1973 (now abandoned). In this embodiment the recording apparatus is wholly disposed within a vacuum chamber. Horizontal shafts 16 and 17 extend from the carriage 15 through sealed bearings 18 and 19 which are disposed respectively in the walls 20 and 21 of the vacuum chamber. The sealed bearings preferably take the form described in U.S. Pat. application Ser. No. 418,263 filed 23rd Nov. 1973 and now U.S. Pat. No. 3,912,284 issued Oct. 14, 1975. The horizontal shafts 16 and 17 are aligned along a translation axis through the point where the rotary axis of the shaft 13 intercepts the upper surface of the film 11. The carriage 15 can be tilted about the translation axis by means of a tilt lever 22 attached to the shaft 17. Translation of the carriage along the translation axis is provided by means of a lead screw 23 driven by a motor 24.

In order to ensure that the disc is translated slowly but without sticking, the arrangement of the lead screw may take the form disclosed in U.S. Pat. application Ser. No. 384,638 filed 1st Aug. 1973 (now abandoned).

The disc 12 carries around its periphery an evenly spaced set of grating lines 25. These grating lines are sensed by an ordinary optical angular position sensor which provides in ordinary fashion signals indicating the rate of movement of the disc in rotation as given by the relative velocity of the grating lines and the encoder. The disc bearing assembly carries a surface 27 which is normal to the aforementioned translation axis and which is arranged to reflect through a sealed window 28 in the chamber wall 20 a laser beam from an ordinary interferometer arrangement illustrated diagrammatically at 30. The interferometer can accordingly provide, in well known fashion, signals denoting the rate of movement of the carriage along the translation axis. The rate of translation of the disc is controlled by the rate at which the disc is rotated. The disc 12 and hence the film 11 is rotated by a synchronous motor 31 housed in a sealed enclosure in the carriage which is sealed from the vacuum chamber. The synchronous motor 31 drives the disc at constant speed which may be in the region of 1,500 rmp. It will be appreciated that this is a convenient synchronous speed and it is selected because it corresponds to the speed at which a video disc should be rotated during playback.

The signals from the encoder 26 accordingly denote a rate of rotation of approximately 1,500 rpm. These signals are compared in frequency with the signals denoting the rate of traverse of the carriage. It is desirable that the frequency of signals denoting the rate of traverse of the carriage and the signals denoting the rotation of the disc be of the same frequency when the disc is being correctly traversed at the right speed but since the speed of rotation is quite high it is necessary to use a divider 32 in order to bring the frequency of the signals from the encoder down to the range of the signals from the interferometer 30. The signals from the divider 32 are compared in phase with the signals from the interferometer 30 by means of a phase comparator 33. Any error signal is amplified by an amplifier 34 and fed to control the motor 34 in ordinary fashion. These arrangements are of an ordinary form normally encountered in a servo-mechanism and their particular construction is not of importance as far as the present invention is concerned. The servo-mechanism could be replaced by an open-loop system in which the lead screw is driven via gearing from the shaft driving the disc or from a second synchronous motor locked in frequency to the motor which provides rotation of the disc. Another possibility is to use an open-loop system but to include the angular position encoder and the interferometer and to feed the error signal from the comparator to adjust by means of deflection plates the position of the electron probe to compensate for slight translational errors.

As has been mentioned, it is necessary, in addition to the deposition of the charge, to heat the thermoplastic film either before or after charge is deposited. It is possible to employ a radio-frequency heater 35 located close to the surface of the thermoplastic film at a point separated from the position of the electron probe in order to heat at least the part of the film where charge is deposited However a further possibility consists in delaying heating until after the completion of scanning and then to heat the film by passing current through the disc itself. For this purpose a peripheral region 36 which is annular and a circular central region 37 of the disc may be cleaned of film before the disc is inserted in the vacuum chamber prior to scanning. Subsequent to the scanning, the passage of current between electrodes applied to the regions 36 and 37 produces a radial flow of current through the disc and the heating of it via the passage of current can produce sufficient heat to soften the thermoplastic film. In such a technique it is desirable to shape the disc so that its thickness varies as a function of radial distance in order that the heat dissipation by virtue of the passage of current may be substantially constant over the area that carries the thermoplastic film.

The vacuum of the vacuum chamber at least near the electron probe should be about $10^{-6}$ torr. However it may not be necessary for both the electron column and the recording medium to be disposed in vacuum. In particular the film itself could be disposed in air. It would be possible for example to direct the electron beam forming the probe through a window in an enclosure in which the electron column itself is disposed. The enclosure itself would be evacuated. The window could be a thin window of titanium, aluminium or other suitable material which is transparent to a beam of electrons. Provided that the film is disposed with its surface close to the window and the energy of the electron beam is sufficiently high, the beam is energetic enough by the time it strikes the thermoplastic film to permit recording in accordance with the present invention.

It is possible to playback the signal recorded in the groove prior to using the film as a master but after its initial metallising by taking advantage of the variation in secondary emission with varying inclination of an electron probe to the surface of the rippled groove in the thermoplastic film. For example, as disclosed in our prior U.S. Pat. application Ser. No. 247,444 filed 28th Apr. 1972 (now abandoned), it is possible to tilt the disc about its axis of translation so that the electron probe can be directed along the towards the groove but at an acute angle to the surface in which the groove is formed. Preferably this angle is about 45°. A collector may face towards the point of incidence of the electron beam on the recorded surface. The collector may be provided with its axis horizontal and in a direction at right-angles to the axis of translation of the carriage. The collector may comprise a cylindrical metal cage with a shielding mesh towards the disc held at an appropriate voltage such as 200 volts positive. Associated with the collector may be a scintillator disc of plastics material onto which emmitted secondary electrons are drawn through the collector mesh. The scintillator disc may be attached to an optical guide of "Perspex" (registered trade mark) which carries light emmitted by the scintillator disc to a glass window in the wall of the chamber. A photomultiplier or other photoelectric transducer may be disposed against the glass window to feed a video amplifier which generates an output voltage signal. However this arrangement is in no way essential to the present invention.

Figure 5:
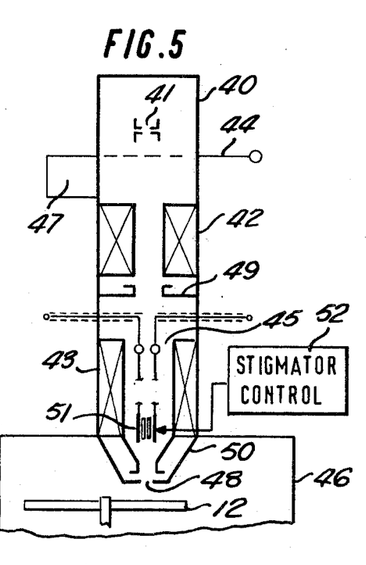
FIG. 5 illustrates an electron beam column suitable for use in the apparatus disclosed in FIG. 4.

FIG. 5 illustrates diagrammatically an electron column which can be used to form the electron probe. The column consists of an electron gun 41 constitues by a lanthanum hexaboride rod cathode, a magnetic lens 42, a further magnetic lens 43, a modulating grid 44, a pair of deflecting plates 45 by which the focused spot can be wobbled and a pair of blanking plates 49. The column also includes an ion pump 47 and a differential pumping aperture 48 in the centre of a conical shield 50 for the lowest part of the column.

The column shown in FIG. 5 includes, for the sake of convenience of illustration, a stigmator 51. This can take the form of a quadrupole or octupole lens and normally consists of four or eight pairs of deflecting plates in the configuration of a regular polygon. The normal purpose of a stigmator is to correct astigmatism in the focussing of an electron beam. For this purpose it is associated with a stigmator control 52, of known form, which is used to vary the field between the various pairs of plates in order to correct any departure from circular of the focussing of the beam.

The current in the electron probe can be modulated, as is known, by varying the current feed to the modulation grid 44.

DEVELOPMENT OF SIGNALS FOR CONTROLLING THE ELECTRON BEAM

Figure 6:
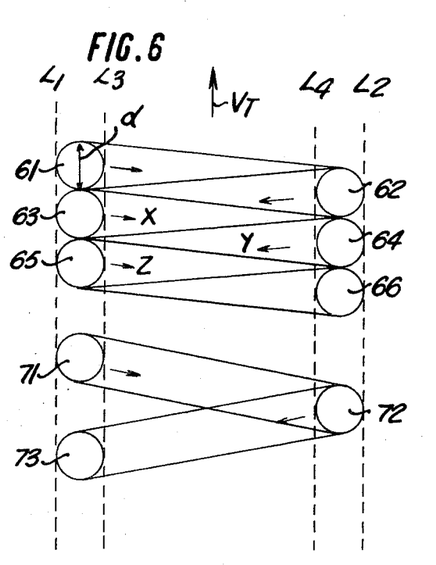
FIG. 6 is an explanatory diagram showing the effect of transverse oscillation of the beam of electrons.

In what follows it will be presumed that it is desired to record a television signal in the form of a frequency modulated carrier signal. However before the apparatus suitable for recording is described, it is convenient to refer firstly to FIG. 6 which illustrates one of the methods by which the problem of depositing a relatively wide track of charge using a relatively narrow circularly focused beam of electrons can be overcome. In the method shown in FIG. 6 the electron beam is transversely oscillated that is to say wobbled from side to side at a relatively high frequency. FIG. 6 illustrates in simplified form the progression of a projection of the beam onto the film which is shown as moving with an effective tangential velocity $V_T$. It will be appreciated that in practice the beam of electrons is oscillated back and forth along a line fixed in space whereas the film moves but for ease of illustration the focused spot 60 in FIG. 6 is shown as progressing over the surfaceof the film. The effective diameter of the spot 60 is shown as $d$ which is approximately 0.64 microns. The beam comes to rest at the extremities of its sideways movement at positions which are fixed in space but as far as the film is concerned the successive rest positions of the beam progress, being located at the successive positions 61, 62, 63, 64 etc. The frequency of transverse oscillation, conveniently termed the wobble-frequency $f_{sw}$, is such that as far as the film is concerned the alternate positions 61, 63, 65 etc. and 62, 64, 66 etc. are respectively aligned and displaced successively by the beam diameter $d$. It will be seen from FIG. 6 that the triangular areas X and Y, which occupy half each of the area of scan between positions 63 and 64 are each scanned twice, the former on the scan between positions 62 and 63 and then on the scan between positions 63 and 64 and the latter on the scan between positions 63 and 64 and then for the second time on the scan between positions 64 and 65. The area Z is scanned first on the scan between positions 64 and 65 and then on the (next) scan between positions 65 and 66 and so on. Thus apart from the very frist scan all the points between the rest positions are covered twice. The parallel lines L1 an L2 denote the extremities of the sideways movement of the beam.

The lines L3 and L4 are spaced inwardly from the lines L1 and L2 respectively and denote the edges of the track of charge that is to be deposited.

Provided that the wobble-frequency is high enough, all the area within the lines L3 and L4 is covered with charge. The lower limit of the frequency is that which, having regard to the diameter of the beam, will ensure deposition of charge twice at every point within the lines L3 and L4. It will be appreciated that the effective tangential velocity $V_T$ varies as the track of charge spirals in towards the centre of the disc and the centre of rotation of the film. One method of ensuring that the wobble-frequency is always high enough is to vary the wobble-frequency as a function of the effective tangential velocity. For example, the dimensions of the disc require in practice maximum and minimum tangential velocity of 15.7 meters per second and 7.85 meters per second respectively. Typical values for the upper and lower limits of the spot wobble-frequency may be selected at 24.2 MHz and 12.1 MHz respectively.

Also illustrated in FIG. 6 is the case where the frequency of transverse oscillation of the beam is insufficiently high, three successive positions of the spot 60 on the film being shown as positions 71, 72 and 73. It will be apparent in this case that within the area delimited by the lines L3 and L4 there will be very substantial areas which are not covered with charge. In general however it does not matter that the wobble-frequency is higher than the minimum necessary to ensure that the beam deposite charge twice at every point on the track.

It can also be seen with reference to FIG. 6 that unless the beam is blanked at the extremities of its side to side movement there will be excessive deposition of charge within the lines L1 and L2 on the one side and the lines L3 and L4 on the other side. The excess deposition of charge in the places mentioned may adversely affect the quality of the recording and in practice it is very desirable to avoid this vestigial deposition of charge in order to reduce the spacing of adjacent convolutions of the spiral track.

In order to produce a distribution of charge which varies across the width of the track, it is desirable, as well as modulating the intensity of the beam for recording the television signal to modulate the intensity of the beam additionally so that the intensity of the beam is greatest when it is in the middle of the track and least when it is at the extremities of its side to side movement. The variation in intensity of the beam for this purpose is, as can be appreciated from a consideration of FIG. 6, twice the wobble frequency.

In our prior application Ser. No. 247,443 and now U.S. Pat. No. 3,821,488, issued June 28, 1974 we disclose the possibility of using a triangle wave of frequency $f_{sw}$ for controlling the transverse oscillation of the beam and a combination of waves at the frequency $2 f_{sw}$ to control the intensity of the beam. For example, the intensity of the beam may, in addition to its variation by the frequency modulated carrier signal, be subject to variation by a rectangular wave of frequency $2 f_{sw}$ and amplitude $V_T$ added to a wave composed of sine-squared pulses occurring at a frequency $2 f_{sw}$ and having an amplitude $V_T$. We have found that it is convenient to generate a clock frequency at 8 times the wobble-frequency and to derive by frequency division sub-multiples of it which can be combined using a simple high-speed logic circuit into suitable wave-forms.

Figure 7:
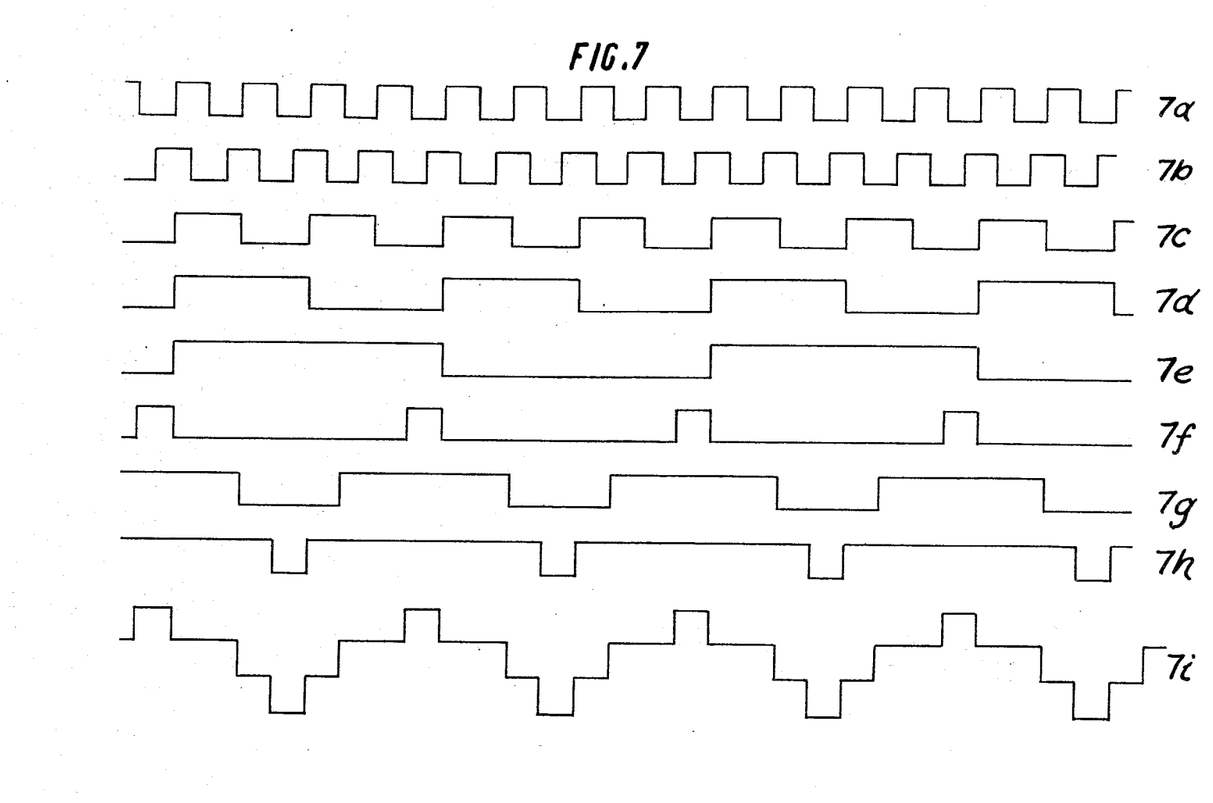
FIG. 7, consisting of 7A through 7I, is an electronic schematic diagram illustrating a preferred embodiment for the production of the signals illustrated in FIG. 6.

The development of various wave-forms suitable for the control of the intensity of the electron beam and its side to side movement if spot-wobble is used is shown in FIG. 7.

FIG. 7a shows a rectangular wave signal of unity mark-to-space ratio, that is to say a "square" wave at 8 $f_{sw}$. FIG. 7b shows a wave similar to the wave of FIG. 7a but displaced therefrom by 90° in phase. FIG. 7c shows a wave at four times the spot-wobble frequency. FIG. 7d is a wave at twice the spot-wobble frequency and FIG. E shows a wave at the spot-wobble fequency. It will be clearly apparent that the waves 7c, 7d and 7e can all be derived from the wave 7a by means of simple dividers and the wave 7b can be derived from the wave 7a using a 90° phase shifter.

From the waves 7a to 7e all the components of the wave 7j, which is a combination of the waves 7f, 7g and 7h can be obtained merely by a simple logic system which acts on the waves 7a to 7e. Thus, using Boolean algebra, wave form 7f changes state when $(A + B + C + D = 0)$ and again when $(\overline{A} + \overline{B} + \overline{C} + \overline{D} = 0)$, wave-form 7g changes state when $(\overline{A} + \overline{B} + C + \overline{D} = 0)$ and again when $(A + B + \overline{C} + D = 0)$ and wave-form 7h changes state when $(A + B + C + \overline{D} = 0)$ and again when $(\overline{A} + \overline{B} + \overline{C} + D = 0)$. Accordingly all that is required is a logic circuit to produce the eight logic outputs from four inputs and the inverse of each of them. Simple addition of wave-form 7f, 7g and 7h gives wave-form 7j. It will be appreciated that the wave-forms 7f, 7g and 7h are selected for determining, respectively, the bottom of the groove 6, the side-walls of the groove 6 and the blanking of the beam of electrons.

The input to the system will be a video signal, conveniently described as having an instantaneous frequency $f_s$ which is by means of a frequency modulator converted to a frequency modulation of a carrier signal. It is found desirable in practice to modulate the amplitude of the frequency modulates signal by the square of the instantaneous signal before it is fed to the grid of the electron column.

ELECTRONIC PROCESSING OF BEAM CONTROL SIGNALS

Figure 8:
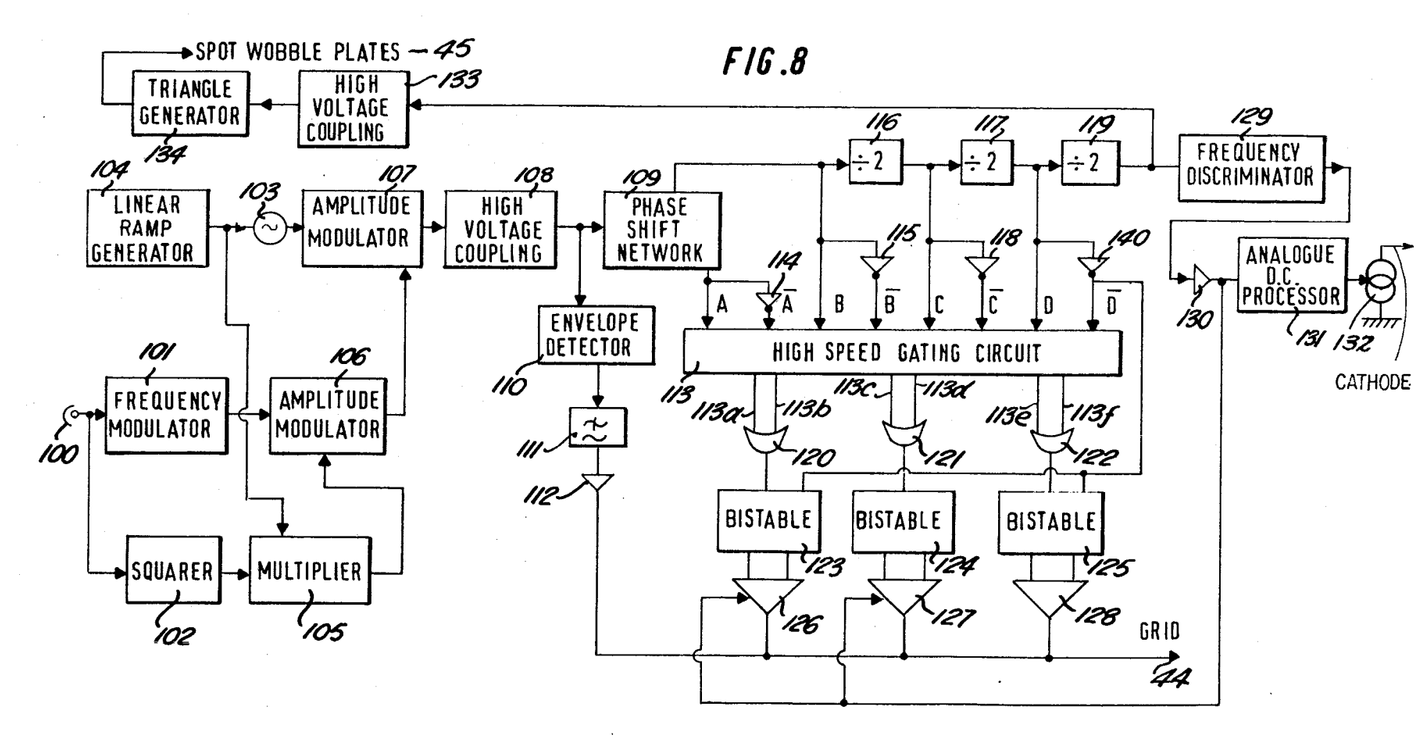
FIG. 8 is a series of wave-form diagrams showing the development of signals which can be used for controlling the electron beam to produce the required profile of groove.

FIG. 8 illustrates in schematic form an electronic circuit suitable for processing a video input and for developing signals for application to the grid and spot-wobble plates of the electron column shown in FIG. 5 and for use in conjunction with the apparatus shown in FIG. 4.

In the system shown in FIG. 8, a video input is received at a coaxial terminal 100. From the terminal 100 the input video signal proceeds to a frequency modulator 101 wherein it is incorporated as a modulation on a carrier signal. The input video signal is also fed to an analogue squarer 102 of which the output is proportional to the square of the instantaneous video signal. In the present embodiment it will be assumed that the spot-wobble frequency will vary with time. The signals necessary for deriving the spot-wobble signal and the various groove-shaping signals are generated by a voltage controlled oscillator 103. This oscillator produces an output frequency which can range between 200 MHz maximum and 100 MHz minimum. In this embodiment it is assumed that the spot-wobble frequency will vary as the effective tangential velocity of the disc and for this purpose the frequency of the voltage controlled oscillator is varied by a linear ramp generator 104. This produces a ramp signal which varies according to the value of k(a-bt) where k, a and b are constants and t represents time. The constants are selected so that the value represented by ka causes the voltage controlled oscillator to produce 200 MHz when scanning starts at the outer region of the film and so that the frequency of the voltage controlled oscillator falls to 100 MHz at the end of scanning where the radius of the spiral path is at a minimum and the tangential velocity of the film is effectively 7.85 meters per second. The output from the linear ramp generator is also fed to one input of an analogue multiplier 105 which multiplies the square of the instantaneous video signal with the reciprocal of the output from the linear ramp generator. The output from the multiplier 105 is fed to a modulating input of an amplitude modulator 106 which modulates the amplitude of the frequency modulated carrier signal in accordance with the output of the multiplier 105. The amplitude modulated, frequency modulated carrier signal produced at the output of the amplitude modulator 106 is fed to a modulating input of another amplitude modulator 107. The amplitude modulator 107 modulates the amplitude of the output of the oscillator 103 with the amplitude modulated, frequency modulated carrier signal so that this latter signal can be conveyed through a high-voltage coupling 108 as a modulation on a multiple of the spot-wobble frequency. The high-voltage coupling, which can be of any suitable form, is employed because the various components of the electron column are at a high voltage relative to ground and the various signals which are used to control the electron beam must be superimposed on the high standing potentials associated with the various components of the electron column.

After the output of the oscillator 103 passes through the high-voltage coupling 108 it is fed firstly to a phase-shift network 109 and also to an envelope detector 110. The envelope detector recovers from the modulated output of the oscillator 103 the output obtained from the amplitude modulator 106. The envelope detector is followed by a low-pass filter 111 which is sufficient to allow the passage of the frequency modulated carrier originally obtained at the output of the modulator 101 and after amplification by an amplifier 112 the frequency modulated carrier is fed to the grid 44 of the electron column shown in FIG. 5.

The phase-shift network 109 produces outputs spaced by 90° of phase, each at a frequency 8 $f_{sw}$. One output of the phase-shift network is fed directly to a high-speed gating circuit 113 as a signal A corresponding to the wave-form 7a in FIG. 7. The signal A is also fed through an invertor 114 to provide the signal $\overline{A}$ to the high-speed gating circuit. The other output of the phase-shift network 109 is fed to the high-speed gating circuit as signal B corresponding to the wave-form 7b in FIG. 7 and to an inverter 115 to produce the inverse of the wave-form 7b, namely $\overline{B}$. The signal B is also fed to a binary divider 116 which develops the signal C corresponding to the wave-form 7c in FIG. 7. This signal is fed to the high-speed gating circuit 113 through an inverter 118 to the high-speed gating circuit as signal $\overline{C}$ and also to a further binary divider 117 which produces signal D at twice the spot-wobble frequency and corresponding to the wave-form 7d in FIG. 7. The signal D is fed to the high-speed gating circuit directly and also to that circuit through an inverter 140. The signal D also feeds a binary divider 119, the output of which is the signal shown at FIG. 7e.

The high-speed gating circuit is relatively simple to construct. It has six output lines 113a, 113b, 113c, 113d, 113e and 113f which provide respectively outputs which in Boolean form correspond to $A + B + C + D = 0$, $\overline{A} + \overline{B} + \overline{C} + \overline{D} = 0$, $\overline{A} + \overline{B} + C + \overline{D} = 0$, $A + B + \overline{C} + D = 0$, $A + B + C + \overline{D} = 0$ and $\overline{A} + \overline{B} + \overline{C} + D = 0$:

The particular arrangement of the high-speed gating circuit forms no part of the present invention. Any suitable form of logic may be used and arranged in accordance with the Boolean expressions given hereinbefore. Reference may be made to "Automatic Digital Computers" by M. V. Wilkes published by John Wiley and Sons Inc. for information on how to construct circuits whose functions are expressed in Boolean algebra.

The three pairs of output lines, the first pair being lines 113a and 113b, the second pair being lines 113c and 113d and the third pair being 113e and 113f are coupled to respective OR circuits 120, 121 and 122. The outputs of these circuits are coupled to the clock inputs of three respective bi-stable latches 123, 124 and 125, and the data inputs of these three bi-stables are fed in common from the output of the inverter 140 which provides the signal $\overline{D}$. The outputs of the bi-stables 123, 124 and 125 are fed respectively to amplifiers 126, 127 and 128. The outputs of the amplifiers 126 and 127 are the signals 7f and 7g respectively. It is desirable to vary the amplitude of these signals in accordance with the variation of effective tangential velocity. This quantity is carried as a frequency modulation on the 8 $f_{sw}$ signal that is transmitted through the high-voltage coupling and a DC signal which may be expressed as $k^1 (a - bt)$ can be recovered from the wobble signal by a frequency discriminator 129. The output of the frequency discriminator can be fed through an amplifier 120 to amplitude modulating inputs of the amplifiers 126 and 127. The output of the frequency discriminator, after amplification by the amplifier 130, is preferably also fed through an analogue DC processor which forms a DC signal proportional to the reciprocal of the effective tangential velocity and the resultant signal controls a current generator 132 which controls a current feed for the cathode 41 of the electron column.

The signal 7e which is obtained at the output of the divider 119 is fed through a further high-voltage coupling 133 to a triangle wave-form generator 134. The output of the triangle generator is fed to control the spot-wobble plate 45 of the electron column.

It was mentioned earlier that although the spot-wobble frequency can vary in proportion to the effective tangential velocity of the disc this is not essential to the present invention. In particular, if the spot-wobble frequency is set high enough, such as more than 25 MHz, corresponding to a frequency of the controlling oscillator of 200 MHz, the linear ramp generator can be omitted or replaced by a source of a steady voltage for controlling the voltage controlled oscillator. Then the signals which represent the effective tangential velocity in the arrangement of FIG. 8 merely become constant.

ASTIGMATIC FOCUSSING OF ELECTRON BEAM

An alternative manner of performing the invention, which leads to a very considerable simplification in processing, uses astigmatism in the focussing of the electron beam. Electron optical systems can be subject to astigmatism in a manner corresponding to ordinary optical systems. If astigmatism is present in the electron optical system then the electron beam is brought to an elongate focus rather than a circular focus. By way of explanation it can be assumed in the simplest case that the beam is brought to an elliptical focus and that along both the major and minor axes of the ellipse the current density follows a Gaussian curve of which the maximum height is at the centre of the ellipse and whose half-height points determine the locus of a point describing the aforementioned ellipse. The effective diameter of the beam can accordingly be very much less along the minor axis of the ellipse than it is along the major axis. Accordingly by employing astigmatism in the focussing of the beam and ensuring that the astigmatic focus is elongate in a direction across the path along which the track of charge is deposited, the required width of track can be provided without the necessity to oscillate the beam from side to side across that path.

Figure 9:
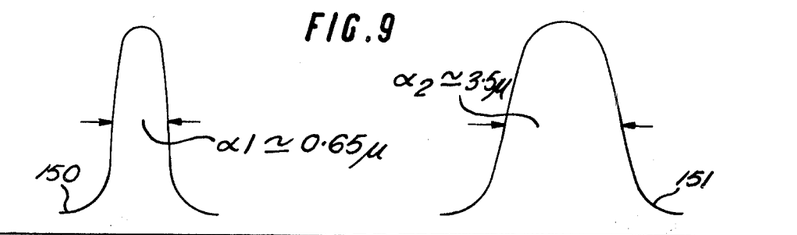
FIG. 9 is a diagram illustrating the effects of astigmatism.

As illustrated in FIG. 9 which illustrates the intensities 150 and 151 of the beam in the directions along and across the track respectively, the effective diameter $d_1$ of the beam in a direction along the progression of the track of charge, is relatively narrow, for example, 0.65 microns, and the effective diameter $d_2$ in the sense across the track is very much larger, for example, 3.5 microns or approximately half that of the desired width of track. It will be appreciated that if the focus is astigmatic there is very much less depth of field in the focus and the method of recording is accordingly more sensitive to variations in the level of the surface of the thermoplastic film.

Figure 10:
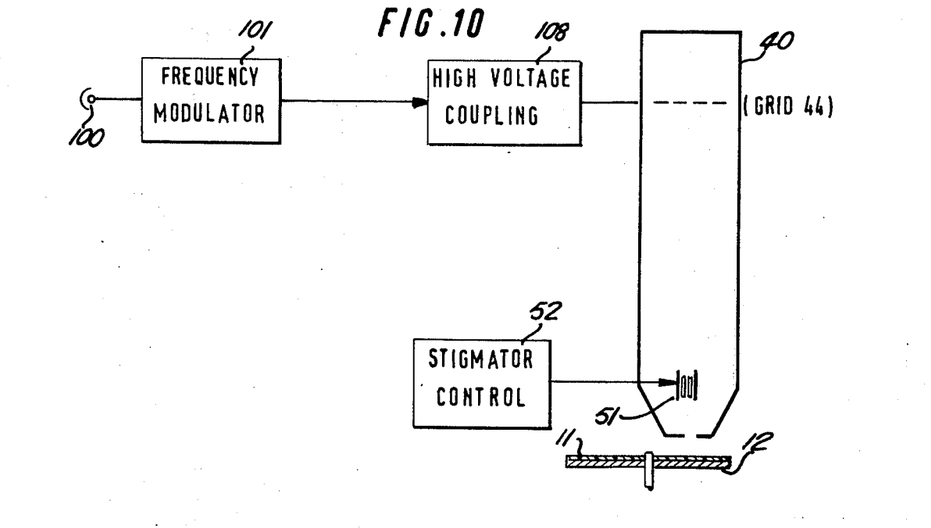
FIG. 10 is a schematic diagram of an alternative embodiment of the invention.

Even so the electronic processing does become very simple as is shown by FIG. 10 which merely consists of those components of FIG. 8 which need to be used in conjunction with the electron column of FIG. 5 in the apparatus of FIG. 4. The input video signal is fed to the frequency modulator where it is fed through a high-voltage coupling to the grid 44 of the electron column. FIG. 10 repeats the illustration of the stigmator control and the stigmator itself in FIG. 5. Instead of being used to rectify astigmatism in the focussing of the electron beam the stigmator control can be used to introduce it as described with reference to FIG. 9. The adjustment of the stigmator to produce the required elliptical focus is quite straightforward and the method of adjustment merely follows the techniques used normally for adjusting stigmators or quadrupole lenses with the exception that the focus is distorted as necessary to produce the required effective diameters along and transverse the path along which charge is to be deposited by the electron beam.

We claim:

1. A method of recording a wide-band signal, comprising the steps of:
    directing a beam of electrons at a thin film of electrically resistive thermoplastic material which is supported by a conductive substrate;
    moving said film relative to said beam so as to cause said beam to deposit a continuous track of electric charge on the film;
    modulating the intensity of the beam in accordance with the said wide-band signal;
    focussing said beam to produce a focus having an effective diameter, in a sense along the direction of progression of the track, which is substantially less than the shortest wavelength in said wide-band signal;
    oscillating said beam from side to side across the direction of progression of said track at a wobble frequency sufficient to ensure the deposition of charge twice on substantially every part of the track;
    blanking said beam at the extremities of its side to side movement;
    varying the intensity of said beam at a frequency which is twice the wobble frequency and with an amplitude which is greatest for the middle of the track, whereby to cause said track to be of a width which is significantly wider than said effective diameter and to have a charge density which is substantially greater in the middle of the track than at the edges thereof; and
    heating and cooling said film.

2. A method according to claim 1 in which the said effective diameter is of the order of 0.5 to 1 microns, the width of the said track is of the order of 3 to 10 microns and the wide-band signal is a carrier signal which is frequency modulated by a television picture signal and has a bandwidth up to 6 MHz.

3. A method according to claim 1 in which said controlling step comprises:
    generating a series of harmonically related signals including said wobble frequency and twice said wobble frequency; and combining selected ones of said signals to produce a composite signal;
    and in which said varying step comprises varying said intensity in response to said composite signal.

4. A method according to claim 1 in which said oscillating step comprises:
    producing a wobble signal of constant frequency; and
    wobbling said beam from side to side in response to said constant frequency signal.

5. A method according to claim 1 in which the oscillating step comprises:
    generating a linear ramp signal;
    generating a wobble signal in a frequency range substantially higher than the highest frequency of said wide-band signal in response to the linear ramp signal; and
    wobbling said beam from side to side in response to the wobble signal.

6. A method according to claim 5 in which said moving step comprises:
    rotating said film in its plane and simultaneously translating said film whereby said track describes a spiral path;
    and in which the step of generating said wobble signal comprises varying the frequency thereof from a maximum frequency to a minimum frequency as said spiral path approaches the centre of rotation of said film.

7. A method of recording a wide-band signal, comprising the steps of:
    aiming an electron column so as to direct a beam of electrons at a thin film of electrically resistive thermoplastic material which is supported by a conductive substrate;
    rotating said film in its plane and simultaneously translating the film so as to cause said beam to deposit a continuous spiral track of electric charge on the film;

generating a first control signal for modulating the intensity of the beam in accordance with the said wide-band signal;

focussing said beam to produce a focus having an effective diameter, in a sense along the direction of progression of the track, which is substantially less than the shortest wavelength in said wide-band signal; generating a second control signal for oscillating said beam from side to side across the direction of progression of said track at a wobble frequency sufficient to ensure the deposition of charge twice on substantially every part of the track;

generating a third control signal for blanking said beam at the extremities of its side to side movement;

generating a fourth control signal for varying the intensity of said beam at a frequency which is twice the wobble frequency and with an amplitude which is greatest for the middle of the track;

coupling through a high voltage coupling said first, second, third and fourth control signals to said electron column so as to effect said modulating, oscillating, blanking and intensity-varying of said beam; and heating and cooling said film.

8. A method according to claim 7 in which said step of generating said second control signal comprises: producing a wobble signal of constant frequency.

9. A method according to claim 7 in which said step of generating said second control signal comprises:

generating a linear ramp signal; and generating a wobble signal in a frequency range substantially higher than the highest frequency of said wide-band signal in response to the linear ramp signal.

* * * * *